(12) United States Patent
Lee et al.

(10) Patent No.: US 11,062,749 B2
(45) Date of Patent: Jul. 13, 2021

(54) DATA OUTPUT METHOD AND SEMICONDUCTOR DEVICE USING THE DATA OUTPUT METHOD

(71) Applicant: SK hynix Inc., Icheon-si (KR)

(72) Inventors: Kwang Hun Lee, Icheon-si (KR); Sang Sic Yoon, Yongin-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/905,401

(22) Filed: Jun. 18, 2020

(65) Prior Publication Data

US 2021/0183419 A1 Jun. 17, 2021

(30) Foreign Application Priority Data

Dec. 16, 2019 (KR) .......................... 10-2019-0168083

(51) Int. Cl.
*G06F 11/10* (2006.01)
*G11C 7/22* (2006.01)
*G11C 8/18* (2006.01)
*G11C 7/10* (2006.01)
*G11C 8/12* (2006.01)

(52) U.S. Cl.
CPC .............. *G11C 7/222* (2013.01); *G11C 7/106* (2013.01); *G11C 7/1066* (2013.01); *G11C 8/18* (2013.01); *G11C 8/12* (2013.01)

(58) Field of Classification Search
CPC .......... G11C 7/106; G11C 7/1066; G11C 8/18
USPC ........................................... 365/233.1
See application file for complete search history.

(56) References Cited

U.S. PATENT DOCUMENTS

| 8,321,779 | B2* | 11/2012 | Shin | ................. | H03M 13/091 |
| | | | | | 714/807 |
| 2009/0222713 | A1* | 9/2009 | Shin | ................. | G06F 11/1004 |
| | | | | | 714/807 |
| 2015/0310904 | A1 | 10/2015 | Kim et al. | | |

FOREIGN PATENT DOCUMENTS

KR 101735091 B1 5/2017

* cited by examiner

*Primary Examiner* — Xiaochun L Chen
(74) *Attorney, Agent, or Firm* — William Park & Associates Ltd.

(57) ABSTRACT

A semiconductor device includes a read control circuit configured to generate first and second output control signals including pulses which are selectively generated, from first and second strobe signals depending on burst information; and a data output circuit configured to latch first internal data depending on the pulse of the first output control signal, transfer second internal data at a time when the second output control signal level-transitions, and generate output data from the latched first internal data and the transferred second internal data.

29 Claims, 12 Drawing Sheets

FIG. 2

| OPERATION | CLK | CS | CA<1> | CA<2> | CA<3> | CA<4> |
|---|---|---|---|---|---|---|
| READ | Rising | H | H | L | L | X |
| | Falling | X | ADD<1> | ADD<2> | ADD<3> | ADD<4> |
| | | | X | X | X | H or L |

DATA OUTPUT METHOD AND SEMICONDUCTOR DEVICE USING THE DATA OUTPUT METHOD

CROSS-REFERENCE TO RELATED APPLICATION

The present application claims priority under 35 U.S.C. § 119(a) to Korean Patent Application No. 10-2019-0168083 filed on Dec. 16, 2019 in the Korean Intellectual Property Office, which is incorporated herein by reference in its entirety.

BACKGROUND

1. Technical Field

Embodiments of the disclosure may generally relate to a semiconductor device, and more particularly, a semiconductor device capable of setting a burst operation to output data in an order set by the burst operation.

2. Related Art

In general, a semiconductor device such as a DRAM includes a plurality of bank groups which are configured by cell arrays to be accessed by the same addresses. Each bank group may be realized to include a plurality of banks. The semiconductor device performs a column operation of selecting one among the plurality of bank groups and outputting data stored in a cell array included in the selected bank group by loading the data on input/output lines.

SUMMARY

In an embodiment, a semiconductor device may include: a read control circuit configured to generate first and second output control signals including pulses which are selectively generated, from first and second strobe signals depending on burst information; and a data output circuit configured to latch first internal data depending on the pulse of the first output control signal, transfer second internal data at a time when the second output control signal level-transitions, and generate output data from the latched first internal data and the transferred second internal data.

In an embodiment, a semiconductor device may include: a memory region including first to fourth bank groups, and configured to output first to fourth internal data stored in the first to fourth bank groups, in a read operation; a read control circuit configured to generate first to fourth strobe signals in the read operation, and generate first to fourth output control signals including pulses which are selectively generated, from the first to fourth strobe signals depending on burst information; and a data output circuit configured to generate output data by latching any one of the first to fourth internal data by pulses of the first to fourth strobe signals and the first to fourth output control signals, and generate the output data by transferring any one of the first to fourth internal data at a time when the first to fourth output control signals level-transition.

In an embodiment, a semiconductor device may include: a read control circuit configured to generate first and second strobe signals depending on burst information input from a command address in a read operation, and generate first and second output control signals including pulses which are selectively generated, from the first and second strobe signals; a first output circuit configured to generate output data by latching first internal data or receiving the first internal data by the first strobe signal and the first output control signal; and a second output circuit configured to generate the output data by latching second internal data or receiving the second internal data by the second strobe signal and the second output control signal.

In an embodiment, a data output method may include: generating output control signals by entering a read operation depending on a logic level combination of a command address, and generating first and second strobe signals and first and second output control signals depending on burst information input from the command address; generating output data including first data by latching first internal data during a period in which pulses of the first strobe signal and the first output control signal are generated; and generating the output data including second data by receiving second internal data at a time point when logic levels of the second strobe signal and the second output control signal transition.

BRIEF DESCRIPTION OF THE DRAWINGS

FIG. 2 is a representation of an example of a table to assist in the explanation of combinations of command addresses for performing a read operation and a burst operation of the semiconductor device in accordance with the embodiment of the disclosure.

DETAILED DESCRIPTION

Figure 1:
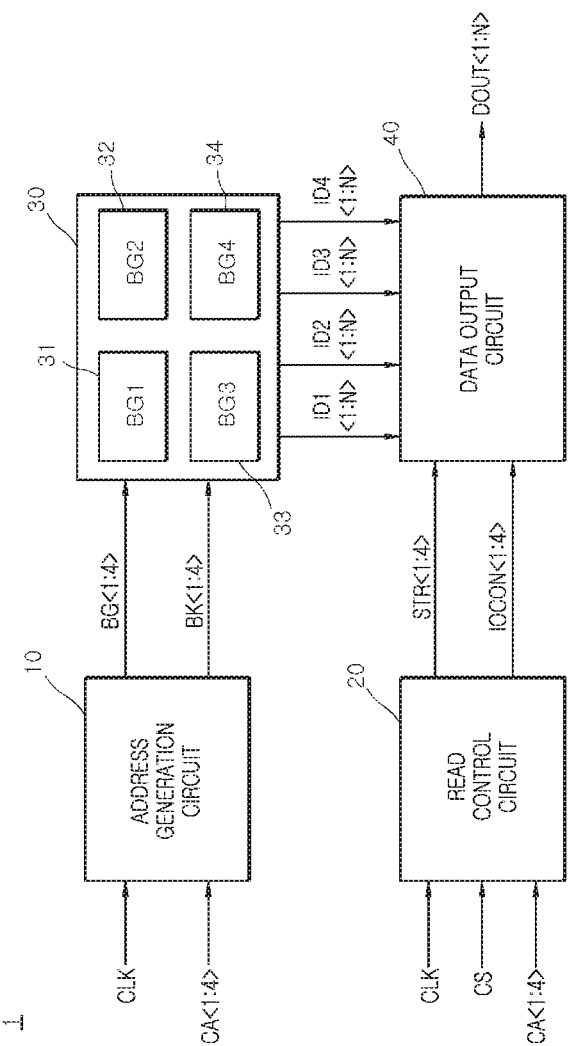
FIG. 1 is a block diagram illustrating a representation of an example of the configuration of a semiconductor device in accordance with an embodiment of the disclosure.

The term "preset" means that the numerical value of a parameter is predetermined when the parameter is used in a process or algorithm. Depending on an embodiment, the numerical value of a parameter may be set when a process or algorithm starts or may be set during a period in which the process or algorithm is executed.

Terms such as "first" and "second" used to distinguish various components are not limited by components. For example, a first component may be named as a second component, and conversely, the second component may be named as the first component.

When it is described that one component is "coupled" or "connected" to another component, it is to be understood that the component may be coupled or connected directly or by the medium of a component. On the other hand, the descriptions of "directly coupled" and "directly connected" should be understood as one component is coupled and connected to another component directly or without intervention of a component.

"Logic high level" and "logic low level" are used to describe logic levels of signals. A signal having a "logic high level" is distinguished from a signal having a "logic low level." For example, when a signal having a first voltage corresponds to a "logic high level," a signal having a second voltage may correspond to a "logic low level." Depending on an embodiment, a "logic high level" may be set to a voltage higher than a "logic low level." Meanwhile, depending on an embodiment, logic levels of signals may be set to different logic levels or opposite logic levels. For example, depending on an embodiment, a signal having a logic high level may be set to have a logic low level, and a signal having a logic low level may be set to have a logic high level.

Hereinafter, a data output method and a semiconductor device using the same will be described below with reference to the accompanying drawings through various examples of embodiments. These embodiments are only for illustrating the disclosure, and the scope of protection of the disclosure is not limited by these embodiments.

In a semiconductor device, a bank group mode, an 8 bank mode and a 16 bank mode may be provided. Each bank group may include a plurality of banks. For example, each bank group may include 4 banks. In the bank group mode, a column operation for 1 bank included in a bank group may be performed by one command. In the 8 bank mode, column operations for 2 banks included in each bank group may be sequentially performed by one command. In the 16 bank mode, column operations for 4 banks included in each bank group may be sequentially performed by one command.

Various embodiments may be directed to a semiconductor device which sets an output priority of internal data through a command address in a burst operation.

Various embodiments may be directed to a semiconductor device which outputs internal data to be output first, through performing a latch operation, and outputs internal data to be output next, through performing a flip-flop operation, in a burst operation.

According to the embodiments of the disclosure, it may be possible to set an output priority of internal data through a command address in a burst operation.

According to the embodiments of the disclosure, by outputting internal data to be output first, through performing a latch operation, and outputting internal data to be output next, through performing a flip-flop operation, in a burst operation, it may be possible to prevent a collision between the internal data even in a high speed operation.

According to the embodiments of the disclosure, by outputting internal data to be output first, as output data, through performing a latch operation, and outputting internal data to be output next, as output data, through performing a flip-flip operation, in a burst operation, it may be possible to secure the reliability of the output data even in a high speed operation.

As illustrated in FIG. 1, a semiconductor device 1 in accordance with an embodiment of the disclosure may include an address generation circuit 10, a read control circuit 20, a memory region 30, and a data output circuit 40.

The address generation circuit 10 may generate first to fourth bank group addresses BG<1:4> and first to fourth bank addresses BK<1:4> from first to fourth command addresses CA<1:4> in synchronization with a clock CLK. The address generation circuit 10 may generate the first to fourth bank group addresses BG<1:4> from the first and second command addresses CA<1:2> in synchronization with the clock CLK. The address generation circuit 10 may generate the first to fourth bank addresses BK<1:4> from the third and fourth command addresses CA<3:4> in synchronization with the clock CLK. The operation of generating the first to fourth bank group addresses BG<1:4> and the first to fourth bank addresses BK<1:4> from the first to fourth command addresses CA<1:4> will be described later with reference to FIG. 2.

The read control circuit 20 may generate first to fourth strobe signals STR<1:4> which are selectively enabled, in a read operation. The read control circuit 20 may generate first to fourth output control signals IOCON<1:4> including pulses which are selectively generated, from the first to fourth strobe signals STR<1:4> by burst information in the read operation. The read control circuit 20 may generate the first to fourth strobe signals STR<1:4> which are selectively enabled, depending on a logic level combination of a chip select signal CS and the first to fourth command addresses CA<1:4> in synchronization with the clock CLK. The read control circuit 20 may generate the first to fourth output control signals IOCON<1:4> including pulses which are selectively generated, from the first to fourth strobe signals STR<1:4> by the burst information input through the fourth command address CA<4> in synchronization with the clock CLK in the read operation. A logic level combination of the chip select signal CS and the first to fourth command addresses CA<1:4> for generating the first to fourth strobe signals STR<1:4> will be described later with reference to FIG. 2. The burst information may be input through the fourth command address CA<4>, and first and second burst operations may be performed depending on the burst information. An operation of setting the burst information and the first and second burst operations will be described later with reference to FIG. 2.

The memory region 30 may include first to fourth bank groups 31, 32, 33 and 34. Each of the first to fourth bank groups 31, 32, 33 and 34 may be realized to include four banks. The memory region 30 may perform the read operation as any one of the first to fourth bank groups 31, 32, 33 and 34 is selected by the first to fourth bank group addresses BG<1:4> and the first to fourth bank addresses BK<1:4>. In the case where the first bank group address BG<1> is enabled in the read operation, the memory region 30 may output first internal data ID1<1:N> which is stored in a bank selected by the first to fourth bank addresses BK<1:4> among the four banks included in the first bank group 31. In the case where the second bank group address BG<2> is enabled in the read operation, the memory region 30 may output second internal data ID2<1:N> which is stored in a bank selected by the first to fourth bank addresses BK<1:4> among the four banks included in the second bank group 32. In the case where the third bank group address BG<3> is enabled in the read operation, the memory region 30 may output third internal data ID3<1:N> which is stored in a bank selected by the first to fourth bank addresses BK<1:4> among the four banks included in the third bank group 33. In the case where the fourth bank group address BG<4> is enabled in the read operation, the memory region 30 may output fourth internal data ID4<1:N> which is stored in a bank selected by the first to fourth bank addresses BK<1:4> among the four banks included in the fourth bank group 34. Although FIG. 1 illustrates that the memory region 30 includes four bank groups, it is to be noted that, depending on an embodiment, the memory region 30 may be realized to include various numbers of bank groups.

The data output circuit 40 may generate output data DOUT<1:N> by latching any one of the first to fourth internal data ID1<1:N>, ID2<1:N>, ID3<1:N> and ID4<1:N> by the pulses of the first to fourth strobe signals STR<1:4> and the first to fourth output control signals IOCON<1:4>. The data output circuit 40 may generate the output data DOUT<1:N> by transferring any one of the first to fourth internal data ID1<1:N>, ID3<1:N> and ID4<1:N> at a time point when the logic levels of the first to fourth strobe signals STR<1:4> and the first to fourth output control signals IOCON<1:4> transition.

The operation of generating the first to fourth bank group addresses BG<1:4> and the first to fourth bank addresses BK<1:4> from the first to fourth command addresses CA<1:4> will be described below with reference to FIG. 2.

The address generation circuit 10 generates the first to fourth bank group addresses BG<1:4> from the first and second command addresses CA<1:2> in synchronization with the falling edge of the clock CLK. The first command address CA<1> is set as a first address ADD<1>, and the second command address CA<2> is set as a second address ADD<2>. In the case where the first and second addresses ADD<1:2> are "L, L," the first bank group address BG<1> is enabled. In the case where the first and second addresses ADD<1:2> are "L, H," the second bank group address BG<2> is enabled. In the case where the first and second addresses ADD<1:2> are "H, L," the third bank group address BG<3> is enabled. In the case where the first and second addresses ADD<1:2> are "H, H," the fourth bank group address BG<4> is enabled. The case where the first and second addresses ADD<1:2> are "L, H" means that the first address ADD<1> is a logic high level H and the second address ADD<2> is a logic low level L.

The address generation circuit 10 generates the first to fourth bank addresses BK<1:4> from the third and fourth command addresses CA<3:4> in synchronization with the falling edge of the clock CLK. The third command address CA<3> is set as a third address ADD<3>, and the fourth command address CA<4> is set as a fourth address ADD<4>. In the case where the third and fourth addresses ADD<3:4> are "L, L," the first bank address BK<1> is enabled. In the case where the third and fourth addresses ADD<3:4> are "L, H," the second bank address BK<2> is enabled. In the case where the third and fourth addresses ADD<3:4> are "H, L," the third bank address BK<3> is enabled. In the case where the third and fourth addresses ADD<3:4> are "H, H," the fourth bank address BK<4> is enabled. The case where the third and fourth addresses ADD<3:4> are "L, H" means that the third address ADD<3> is a logic high level H and the fourth address ADD<4> is a logic low level L. The 'x' shown in FIG. 2 means don't care.

A logic level combination of the chip select signal CS and the first to fourth command addresses CA<1:4> for generating the first to fourth strobe signals STR<1:4> in a read operation READ will be described below with reference to FIG. 2.

The read control circuit 20 generates a read signal RD (see FIG. 3) in the case where, in synchronization with the rising edge of the clock CLK, the chip select signal CS is a logic high level H, the first command address CA<1> is a logic high level H, the second command address CA<2> is a logic low level L and the third command address CA<3> is a logic low level L. The level of fourth command address CA<4> is set as don't care. The read control circuit 20 generates the first to fourth strobe signals STR<1:4> which are selectively enabled, from the read signal RD by the burst information input through the fourth command address CA<4> in synchronization with the falling edge of the clock CLK. The read control circuit 20 generates the first to fourth output control signals IOCON<1:4> including pulses which are selectively generated, from the first to fourth strobe signals STR<1:4> by the burst information input through the fourth command address CA<4> in synchronization with the falling edge of the clock CLK. The 'x' shown in FIG. 2 means don't care.

The first and second burst operations set by the burst information input through the fourth command address CA<4> will be described below with reference to FIG. 2.

In the case where the burst information input through the fourth command address CA<4> in synchronization with the falling edge of the clock CLK is input at a logic low level L, the first burst operation is set. The level of chip select signal CS is set as don't care. The level of second command address CA<2> is set as don't care. The level of third command address CA<3> is set as don't care. The 'x' shown in FIG. 2 means don't care.

The first burst operation means an operation in which the first internal data ID1<1:N> is output as the output data DOUT<1:N> and thereafter the second internal data ID2<1:N> is output as the output data DOUT<1:N>, in a read operation. Also, the first burst operation means an operation in which the third internal data ID3<1:N> is output as the output data DOUT<1:N> and thereafter the fourth internal data ID4<1:N> is output as the output data DOUT<1:N>, in a read operation.

Depending on an embodiment, the first burst operation may be set as an operation in which the first internal data ID1<1:N> is output as the output data DOUT<1:N> and thereafter the third internal data ID3<1:N> is output as the output data DOUT<1:N>, in a read operation. Also, depending on an embodiment, the first burst operation may be set as an operation in which the second internal data ID2<1:N> is output as the output data DOUT<1:N> and thereafter the fourth internal data ID4<1:N> is output as the output data DOUT<1:N>, in a read operation.

In the case where the burst information input through the fourth command address CA<4> in synchronization with the falling edge of the dock CLK is input at a logic high level H, the second burst operation is set. The level of chip select signal CS is set as don't care. The level of second command address CA<2> is set as don't care. The level of third command address CA<3> is set as don't care. The 'x' shown in FIG. 2 means don't care.

The second burst operation means an operation in which the second internal data ID2<1:N> is output as the output data DOUT<1:N> and thereafter the first internal data ID1<1:N> is output as the output data DOUT<1:N>, in a read operation. Also, the second burst operation means an operation in which the fourth internal data ID4<1:N> is output as the output data DOUT<1:N> and thereafter the third internal data ID3<1:N> is output as the output data DOUT<1:N>, in a read operation.

Depending on an embodiment, the second burst operation may be set as an operation in which the third internal data ID3<1:N> is output as the output data DOUT<1:N> and thereafter the first internal data ID1<1:N> is output as the output data DOUT<1:N>, in a read operation. Also, depending on an embodiment, the second burst operation may be set as an operation in which the fourth internal data ID4<1:N> is output as the output data DOUT<1:N> and thereafter the second internal data ID2<1:N> is output as the output data DOUT<1:N>, in a read operation.

Figure 3:
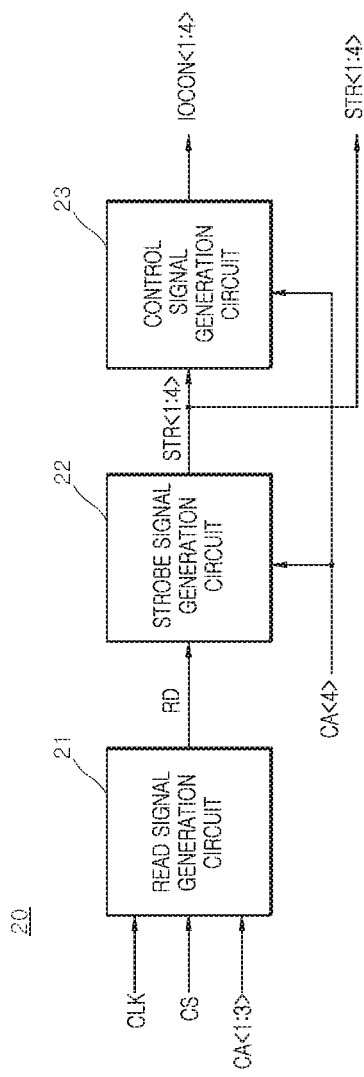
FIG. 3 is a block diagram illustrating a representation of an example of a read control circuit included in the semiconductor device illustrated in FIG. 1.

Referring to FIG. 3, the read control circuit 20 may include a read signal generation circuit 21, a strobe signal generation circuit 22, and a control signal generation circuit 23.

The read signal generation circuit 21 may generate the read signal RD which is enabled in the case where the chip select signal CS and the first to third command addresses CA<1:3> are a preset combination in synchronization with the clock CLK.

Referring to FIGS. 2 and 3, the read signal generation circuit 21 may generate the read signal RD which is enabled in the case where, in synchronization with the rising edge of the clock CLK, the chip select signal CS is a logic high level H, the first command address CA<1> is a logic high level H, the second command address CA<2> is a logic low level L and the third command address CA<3> is a logic low level L. The read signal RD may be generated to include a pulse of a logic high level or a logic low level.

The strobe signal generation circuit 22 may generate the first to fourth strobe signals STR<1:4> including pulses which are selectively generated, from the read signal RD depending on the logic level of the fourth command address CA<4> including the burst information.

In the case of the first burst operation according to the burst information, the strobe signal generation circuit 22 may generate the first strobe signal STR<1> and thereafter generate the second strobe signal STR<2>, from the read signal RD. In the case of the first burst operation according to the burst information, the strobe signal generation circuit 22 may generate the third strobe signal STR<3> and thereafter generate the fourth strobe signal STR<4>, from the read signal RD.

In the case of the second burst operation according to the burst information, the strobe signal generation circuit 22 may generate the second strobe signal STR<2> and thereafter generate the first strobe signal STR<1>, from the read signal RD. In the case of the second burst operation according to the burst information, the strobe signal generation circuit 22 may generate the fourth strobe signal STR<4> and thereafter generate the third strobe signal STR<3>, from the read signal RD.

The control signal generation circuit 23 may generate the first to fourth output control signals IOCON<1:4> by transferring or blocking the first to fourth strobe signals STR<1:4> depending on the logic level of the fourth command address CA<4>.

The control signal generation circuit 23 may generate the first output control signal IOCON<1> by blocking the first strobe signal STR<1> in the case where the fourth command address CA<4> is a logic low level. The control signal generation circuit 23 may generate the second output control signal IOCON<2> by transferring the second strobe signal STR<2> in the case where the fourth command address CA<4> is a logic low level. The control signal generation circuit 23 may generate the third output control signal IOCON<3> by blocking the third strobe signal STR<3> in the case where the fourth command address CA<4> is a logic low level. The control signal generation circuit 23 may generate the fourth output control signal IOCON<4> by transferring the fourth strobe signal STR<4> in the case where the fourth command address CA<4> is a logic low level.

The control signal generation circuit 23 may generate the first output control signal IOCON<1> by transferring the first strobe signal STR<1> in the case where the fourth command address CA<4> is a logic high level. The control signal generation circuit 23 may generate the second output control signal IOCON<2> by blocking the second strobe signal STR<2> in the case where the fourth command address CA<4> is a logic high level. The control signal generation circuit 23 may generate the third output control signal IOCON<3> by transferring the third strobe signal STR<3> in the case where the fourth command address CA<4> is a logic high level. The control signal generation circuit 23 may generate the fourth output control signal IOCON<4> by blocking the fourth strobe signal STR<4> in the case where the fourth command address CA<4> is a logic high level.

Figure 4:
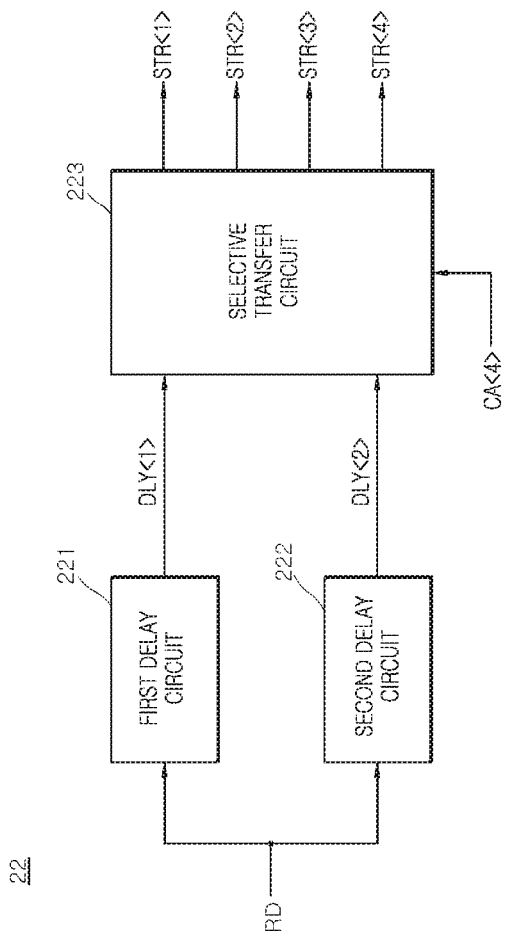
FIG. 4 is a block diagram illustrating a representation of an example of a strobe signal generation circuit included in the read control circuit illustrated in FIG. 3.

Referring to FIG. 4, the strobe signal generation circuit 22 may include a first delay circuit 221, a second delay circuit 222, and a selective transfer circuit 223.

The first delay circuit 221 may generate a first delay signal DLY<1> by delaying the read signal RD by a first delay amount. The first delay circuit 221 may be realized by a general inverter chain. The first delay amount of the first delay circuit 221 may be set variously depending on an embodiment.

The second delay circuit 222 may generate a second delay signal DLY<2> by delaying the read signal RD by a second delay amount. The second delay circuit 222 may be realized by a general inverter chain. The second delay amount of the second delay circuit 222 may be set variously depending on an embodiment. The second delay amount may be set to be larger than the first delay amount.

The selective transfer circuit 223 may output any one of the first delay signal DLY<1> and the second delay signal DLY<2> as the first to fourth strobe signals STR<1:4> depending on the logic level of the fourth command address CA<4>.

The selective transfer circuit 223 may output the first delay signal DLY<1> as the first strobe signal STR<1> in the case where the fourth command address CA<4> is a logic low level. The selective transfer circuit 223 may output the second delay signal DLY<2> as the second strobe signal STR<2> in the case where the fourth command address CA<4> is a logic low level. The selective transfer circuit 223 may output the first delay signal DLY<1> as the third strobe signal STR<3> in the case where the fourth command address CA<4> is a logic low level. The selective transfer circuit 223 may output the second delay signal DLY<2> as the fourth strobe signal STR<4> in the case where the fourth command address CA<4> is a logic low level.

The selective transfer circuit 223 may output the first delay signal DLY<1> as the second strobe signal STR<2> in the case where the fourth command address CA<4> is a logic high level. The selective transfer circuit 223 may output the second delay signal DLY<2> as the first strobe signal STR<1> in the case where the fourth command address CA<4> is a logic high level. The selective transfer circuit 223 may output the first delay signal DLY<1> as the fourth strobe signal STR<4> in the case where the fourth command address CA<4> is a logic high level. The selective transfer circuit 223 may output the second delay signal DLY<2> as the third strobe signal STR<3> in the case where the fourth command address CA<4> is a logic high level.

Figure 5:
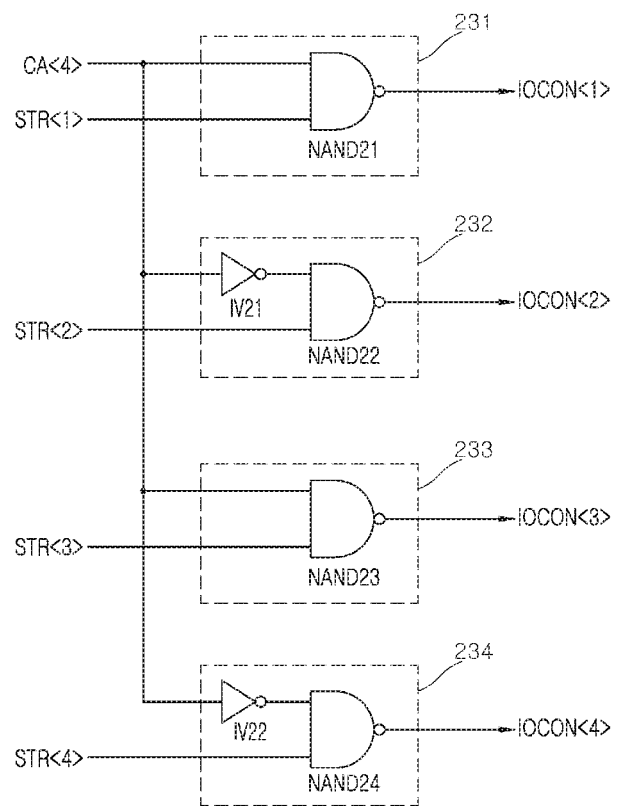
FIG. 5 is a circuit diagram illustrating a representation of an example of a control signal generation circuit included in the read control circuit illustrated in FIG. 3.

Referring to FIG. 5, the control signal generation circuit 23 may include a first logic circuit 231, a second logic circuit 232, a third logic circuit 233, and a fourth logic circuit 234.

The first logic circuit 231 may be realized by a NAND gate NAND21. The first logic circuit 231 may generate the first output control signal IOCON<1> by blocking the input of the first strobe signal STR<1> in the case where the fourth command address CA<4> is a logic low level (a first logic level). The first logic circuit 231 may generate the first output control signal IOCON<1> of a logic high level (a second logic level) in the case where the fourth command address CA<4> is a logic low level (a first logic level). The first logic circuit 231 may generate the first output control signal IOCON<1> by transferring the first strobe signal STR<1> in the case where the fourth command address CA<4> is a logic high level (a second logic level). The first logic circuit 231 may generate the first output control signal IOCON<1> by inverting and buffering the first strobe signal STR<1> in the case where the fourth command address CA<4> is a logic high level (a second logic level).

The second logic circuit 232 may be realized by an inverter IV21 and a NAND gate NAND22. The second logic circuit 232 may generate the second output control signal IOCON<2> by transferring the second strobe signal STR<2> in the case where the fourth command address CA<4> is a logic low level (a first logic level). The second logic circuit 232 may generate the second output control signal IOCON<2> by inverting and buffering the second strobe signal STR<2> in the case where the fourth command address CA<4> is a logic low level (a first logic level). The second logic circuit 232 may generate the second output control signal IOCON<2> by blocking the input of the second strobe signal STR<2> in the case where the fourth command address CA<4> is a logic high level (a second logic level). The second logic circuit 232 may generate the second output control signal IOCON<2> of a logic high level (a second logic level) in the case where the fourth command address CA<4> is a logic high level (a second logic level).

The third logic circuit 233 may be realized by a NAND gate NAND23. The third logic circuit 233 may generate the third output control signal IOCON<3> by blocking the input of the third strobe signal STR<3> in the case where the fourth command address CA<4> is a logic low level (a first logic level). The third logic circuit 233 may generate the third output control signal IOCON<3> of a logic high level (a second logic level) in the case where the fourth command address CA<4> is a logic low level (a first logic level). The third logic circuit 233 may generate the third output control signal IOCON<3> by transferring the third strobe signal STR<3> in the case where the fourth command address CA<4> is a logic high level (a second logic level). The third logic circuit 233 may generate the third output control signal IOCON<3> by inverting and buffering the third strobe signal STR<3> in the case where the fourth command address CA<4> is a logic high level (a second logic level).

The fourth logic circuit 234 may be realized by an inverter IV22 and a NAND gate NAND24. The fourth logic circuit 234 may generate the fourth output control signal IOCON<4> by transferring the fourth strobe signal STR<4> in the case where the fourth command address CA<4> is a logic low level (a first logic level). The fourth logic circuit 234 may generate the fourth output control signal IOCON<4> by inverting and buffering the fourth strobe signal STR<4> in the case where the fourth command address CA<4> is a logic low level (a first logic level). The fourth logic circuit 234 may generate the fourth output control signal IOCON<4> by blocking the input of the fourth strobe signal STR<4> in the case where the fourth command address CA<4> is a logic high level (a second logic level). The fourth logic circuit 234 may generate the fourth output control signal IOCON<4> of a logic high level (a second logic level) in the case where the fourth command address CA<4> is a logic high level (a second logic level).

Figure 6:
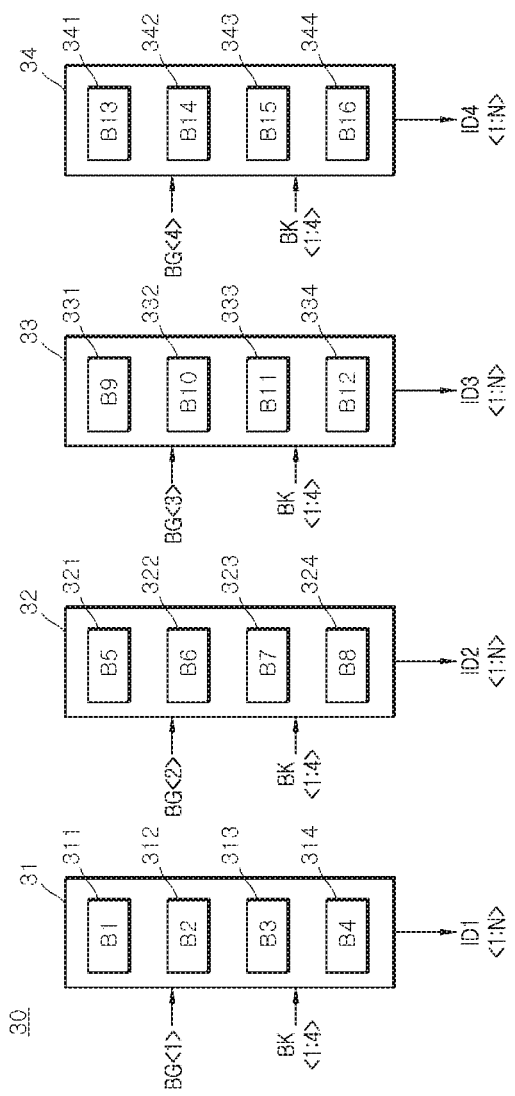
FIG. 6 is a block diagram illustrating a representation of an example of a memory region included in the semiconductor device illustrated in FIG. 1.

Referring to FIG. 6, the memory region 30 may include the first bank group 31, the second bank group 32, the third bank group 33, and the fourth bank group 34.

The first bank group 31 may include a first bank 311, a second bank 312, a third bank 313, and a fourth bank 314.

The first bank 311 may be selected and output data stored therein as the first internal data ID1<1:N>, in the case where the first bank group address BG<1> is enabled and the first bank address BK<1> is enabled in a read operation. The second bank 312 may be selected and output data stored therein as the first internal data ID1<1:N>, in the case where the first bank group address BG<1> is enabled and the second bank address BK<2> is enabled in a read operation. The third bank 313 may be selected and output data stored therein as the first internal data ID1<1:N>, in the case where the first bank group address BG<1> is enabled and the third bank address BK<3> is enabled in a read operation. The fourth bank 314 may be selected and output data stored therein as the first internal data ID1<1:N>, in the case where the first bank group address BG<1> is enabled and the fourth bank address BK<4> is enabled in a read operation.

The second bank group 32 may include a fifth bank 321, a sixth bank 322, a seventh bank 323, and an eighth bank 324.

The fifth bank 321 may be selected and output data stored therein as the second internal data ID2<1:N>, in the case where the second bank group address BG<2> is enabled and the first bank address BK<1> is enabled in a read operation. The sixth bank 322 may be selected and output data stored therein as the second internal data ID2<1:N>, in the case where the second bank group address BG<2> is enabled and the second bank address BK<2> is enabled in a read operation. The seventh bank 323 may be selected and output data stored therein as the second internal data ID2<1:N>, in the case where the second bank group address BG<2> is enabled and the third bank address BK<3> is enabled in a read operation. The eighth bank 324 may be selected and output data stored therein as the second internal data ID2<1:N>, in the case where the second bank group address BG<2> is enabled and the fourth bank address BK<4> is enabled in a read operation.

The third bank group 33 may include a ninth bank 331, a tenth bank 332, an eleventh bank 333, and a twelfth bank 334.

The ninth bank 331 may be selected and output data stored therein as the third internal data ID3<1:N>, in the case where the third bank group address BG<3> is enabled and the first bank address BK<1> is enabled in a read operation. The tenth bank 332 may be selected and output data stored therein as the third internal data ID3<1:N>, in the case where the third bank group address BG<3> is enabled and the second bank address BK<2> is enabled in a read operation. The eleventh bank 333 may be selected and output data stored therein as the third internal data ID3<1:N>, in the case where the third bank group address BG<3> is enabled and to the third bank address BK<3> is enabled in a read operation. The twelfth bank 334 may be selected and output data stored therein as the third internal data ID3<1:N>, in the case where the third bank group address BG<3> is enabled and the fourth bank address BK<4> is enabled in a read operation.

The fourth bank group 34 may include a thirteenth bank 341, a fourteenth bank 342, a fifteenth bank 343, and a sixteenth bank 344.

The thirteenth bank 341 may be selected and output data stored therein as the fourth internal data ID4<1:N>, in the case where the fourth bank group address BG<4> is enabled and the first bank address BK<1> is enabled in a read operation. The fourteenth bank 342 may be selected and output data stored therein as the fourth internal data ID4<1:N>, in the case where the fourth bank group address BG<4> is enabled and the second bank address BK<2> is enabled in a read operation. The fifteenth bank 343 may be selected and output data stored therein as the fourth internal data ID4<1:N>, in the case where the fourth bank group address BG<4> is enabled and the third bank address BK<3> is enabled in a read operation. The sixteenth bank 344 may be selected and output data stored therein as the fourth internal data ID4<1:N>, in the case where the fourth bank group address BG<4> is enabled and the fourth bank address BK<4> is enabled in a read operation.

While the first bank group 31, the second bank group 32, the third bank group 33 and the fourth bank group 34 are realized to perform a read operation for the sake of convenience in explanation, it is to be noted that they may be realized to perform a write operation to store the first internal data ID1<1:N>, the second internal data ID2<1:N>, the third internal data ID3<1:N> and the fourth internal data ID4<1:N>.

Figure 7:
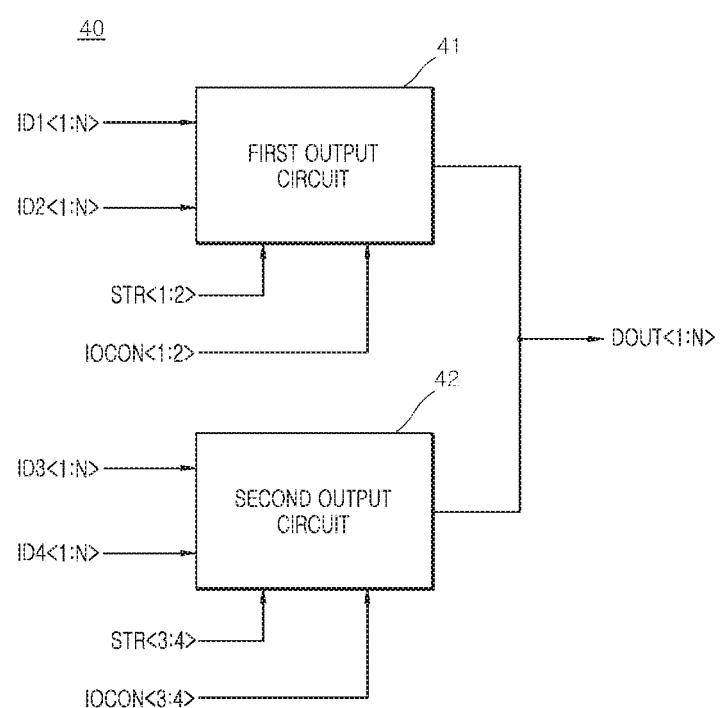
FIG. 7 is a block diagram illustrating a representation of an example of a data output circuit included in the semiconductor device illustrated in FIG. 1.

Referring to FIG. 7, the data output circuit 40 may include a first output circuit 41 and a second output circuit 42.

The first output circuit 41 may output the output data DOUT<1:N> by latching any one of the first internal data ID1<1:N> and the second internal data ID2<1:N> depending on the logic levels of the first and second strobe signals STR<1:2> and the first and second output control signals IOCON<1:2>, and thereafter, may output the output data DOUT<1:N> by receiving the other of the first internal data ID1<1:N> and the second internal data ID2<1:N> which is not selected.

The second output circuit 42 may output the output data DOUT<1:N> by latching any one of the third internal data ID3<1:N> and the fourth internal data ID4<1:N> depending on the logic levels of the third and fourth strobe signals STR<3:4> and the third and fourth output control signals IOCON<3:4>, and thereafter, may output the output data DOUT<1:N> by receiving the other of the third internal data ID3<1:N> and the fourth internal data ID4<1:N> which is not selected.

Figure 8:
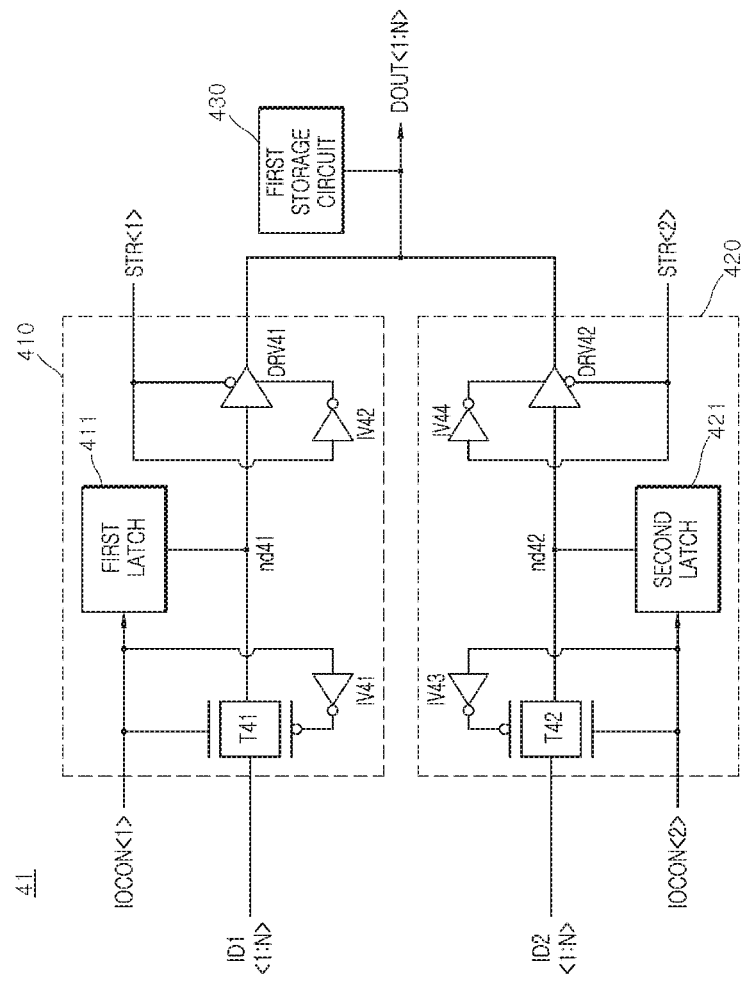
FIG. 8 is a circuit diagram illustrating a representation of an example of a first output circuit included in the data output circuit illustrated in FIG. 7.

Referring to FIG. 8, the first output circuit 41 may include a first data transfer circuit 410, a second data transfer circuit 420, and a first storage circuit 430.

The first data transfer circuit 410 may be realized by a transfer gate T41, inverters IV41 and IV42, a driver DRV41, and a first latch 411. The transfer gate T41 may receive the first internal data ID1<1:N> and output the first internal data ID1<1:N> to a first node nd41 during a period in which the first output control signal IOCON<1> is a logic high level. The first latch 411 may latch a signal of the first node nd41 during a period in which the first output control signal IOCON<1> is a logic high level. The driver DRV41 may drive the output data DOUT<1:N> depending on the logic level of the first node nd41 during a period in which the first strobe signal STR<1> is a logic low level. The first data transfer circuit 410 may generate the output data DOUT<1:N> by latching or transferring the first internal data ID1<1:N> depending on the logic levels of the first strobe signal STR<1> and the first output control signal IOCON<1>.

The first data transfer circuit 410 may latch the first internal data ID1<1:N> during a period in which the first output control signal IOCON<1> is a logic high level, and may generate the output data DOUT<1:N> from the latched first internal data ID1<1:N> at a time point when the first strobe signal STR<1> transitions from a logic low level to a logic high level. At this time, the first data transfer circuit 410 may operate like a latch circuit, and thereby, may to generate the output data DOUT<1:N> from the first internal data ID1<1:N>.

The first data transfer circuit 410 may generate the output data DOUT<1:N> from the first internal data ID1<1:N> which is transferred at a time point when the first output control signal IOCON<1> transitions from a logic high level to a logic low level and the first strobe signal STR<1> transitions from a logic low level to a logic high level. At this time, the first data transfer circuit 410 may operate like a flip-flop circuit, and thereby, may generate the output data DOUT<1:N> from the first internal data ID1<1:N>.

The second data transfer circuit 420 may be realized by a transfer gate T42, inverters IV43 and IV44, a driver DRV42, and a second latch 421. The transfer gate T42 may receive the second internal data ID2<1:N> and output the second internal data ID2<1:N> to a second node nd42 during a period in which the second output control signal IOCON<2> is a logic high level. The second latch 421 may latch a signal of the second node nd42 during a period in which the second output control signal IOCON<2> is a logic high level. The driver DRV42 may drive the output data DOUT<1:N> depending on the logic level of the second node nd42 during a period in which the second strobe signal STR<2> is a logic low level. The second data transfer circuit 420 may generate the output data DOUT<1:N> by latching or transferring the second internal data ID2<1:N> depending on the logic levels of the second strobe signal STR<2> and the second output control signal IOCON<2>.

The second data transfer circuit 420 may latch the second internal data ID2<1:N> during a period in which the second output control signal IOCON<2> is a logic high level, and may generate the output data DOUT<1:N> from the latched second internal data ID2<1:N> at a time point when the second strobe signal STR<2> transitions from a logic low level to a logic high level. At this time, the second data transfer circuit 420 may operate like a latch circuit, and thereby, may generate the output data DOUT<1:N> from the second internal data ID2<1:N>.

The second data transfer circuit 420 may generate the output data DOUT<1:N> from the second internal data ID2<1:N> which is transferred at a time point when the second output control signal IOCON<2> transitions from a logic high level to a logic low level and the second strobe signal STR<2> transitions from a logic low level to a logic high level. At this time, the second data transfer circuit 420 may operate like a flip-flop circuit, and thereby, may generate the output data DOUT<1:N> from the second internal data ID2<1:N>.

The first storage circuit 430 may store the output data DOUT<1:N>.

Figure 9:
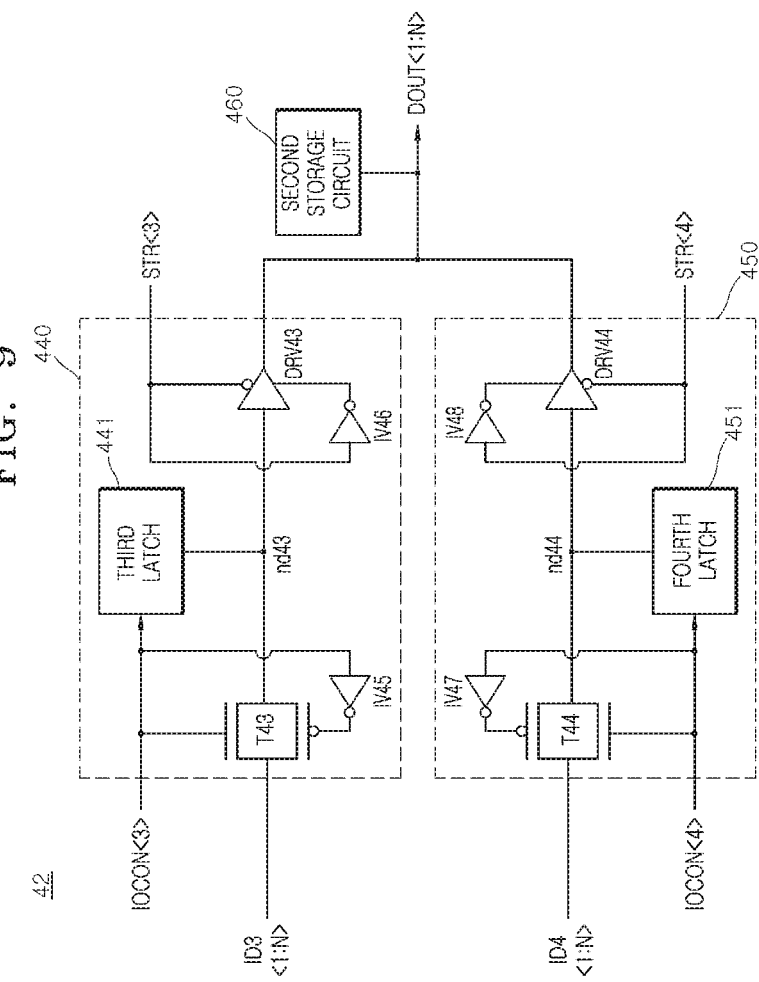
FIG. 9 is a circuit diagram illustrating a representation of an example of a second output circuit included in the data output circuit illustrated in FIG. 7.

Referring to FIG. 9, the second output circuit 42 may include a third data transfer circuit 440, a fourth data transfer circuit 450, and a second storage circuit 460.

The third data transfer circuit 440 may be realized by a transfer gate T43, inverters IV45 and IV46, a driver DRV43, and a third latch 441. The transfer gate T43 may receive the third internal data ID3<1:N> and output the third internal data ID3<1:N> to a third node nd43 during a period in which the third output control signal IOCON<3> is a logic high level. The third latch 441 may latch a signal of the third node nd43 during a period in which the third output control signal IOCON<3> is a logic high level. The driver DRV43 may drive the output data DOUT<1:N> depending on the logic level of the third node nd43 during a period in which the third strobe signal STR<3> is a logic low level. The third data transfer circuit 440 may generate the output data DOUT<1:N> by latching or transferring the third internal data ID3<1:N> depending on the logic levels of the third strobe signal STR<3> and the third output control signal IOCON<3>.

The third data transfer circuit 440 may latch the third internal data ID3<1:N> during a period in which the third output control signal IOCON<3> is a logic high level, and may generate the output data DOUT<1:N> from the latched third internal data ID3<1:N> at a time point when the third strobe signal STR<3> transitions from a logic low level to a logic high level. At this time, the third data transfer circuit 440 may operate like a latch circuit, and thereby, may generate the output data DOUT<1:N> from the third internal data ID3<1:N>.

The third data transfer circuit 440 may generate the output data DOUT<1:N> from the third internal data ID3<1:N> which is transferred at a time point when the third output control signal IOCON<3> transitions from a logic high level to a logic low level and the third strobe signal STR<3> transitions from a logic low level to a logic high level. At this time, the third data transfer circuit 440 may operate like a flip-flop circuit, and thereby, may generate the output data DOUT<1:N> from the third internal data ID3<1:N>.

The fourth data transfer circuit 450 may be realized by a transfer gate T44, inverters IV47 and IV48, a driver DRV44, and a fourth latch 451. The transfer gate T44 may receive the fourth internal data ID4<1:N> and output the fourth internal data ID4<1:N> to a fourth node nd44 during a period in which the fourth output control signal IOCON<4> is a logic high level. The fourth latch 451 may latch a signal of the fourth node nd44 during a period in which the fourth output control signal IOCON<4> is a logic high level. The driver DRV44 may drive the output data DOUT<1:N> depending on the logic level of the fourth node nd44 during a period in which the fourth strobe signal STR<4> is a logic low level. The fourth data transfer circuit 450 may generate the output data DOUT<1:N> by latching or transferring the fourth internal data ID4<1:N> depending on the logic levels of the fourth strobe signal STR<4> and the fourth output control signal IOCON<4>.

The fourth data transfer circuit 450 may latch the fourth internal data ID4<1:N> during a period in which the fourth output control signal IOCON<4> is a logic high level, and may generate the output data DOUT<1:N> from the latched fourth internal data ID4<1:N> at a time point when the fourth strobe signal STR<4> transitions from a logic low level to a logic high level. At this time, the fourth data transfer circuit 450 may operate like a latch circuit, and thereby, may generate the output data DOUT<1:N> from the fourth internal data ID4<1:N>.

The fourth data transfer circuit 450 may generate the output data DOUT<1:N> from the fourth internal data ID4<1:N> which is transferred at a time point when the fourth output control signal IOCON<4> transitions from a logic high level to a logic low level and the fourth strobe signal STR<4> transitions from a logic low level to a logic high level. At this time, the fourth data transfer circuit 450 may operate like a flip-flop circuit, and thereby, may generate the output data DOUT<1:N> from the fourth internal data ID4<1:N>.

The second storage circuit 460 may store the output data DOUT<1:N>.

Figure 10:
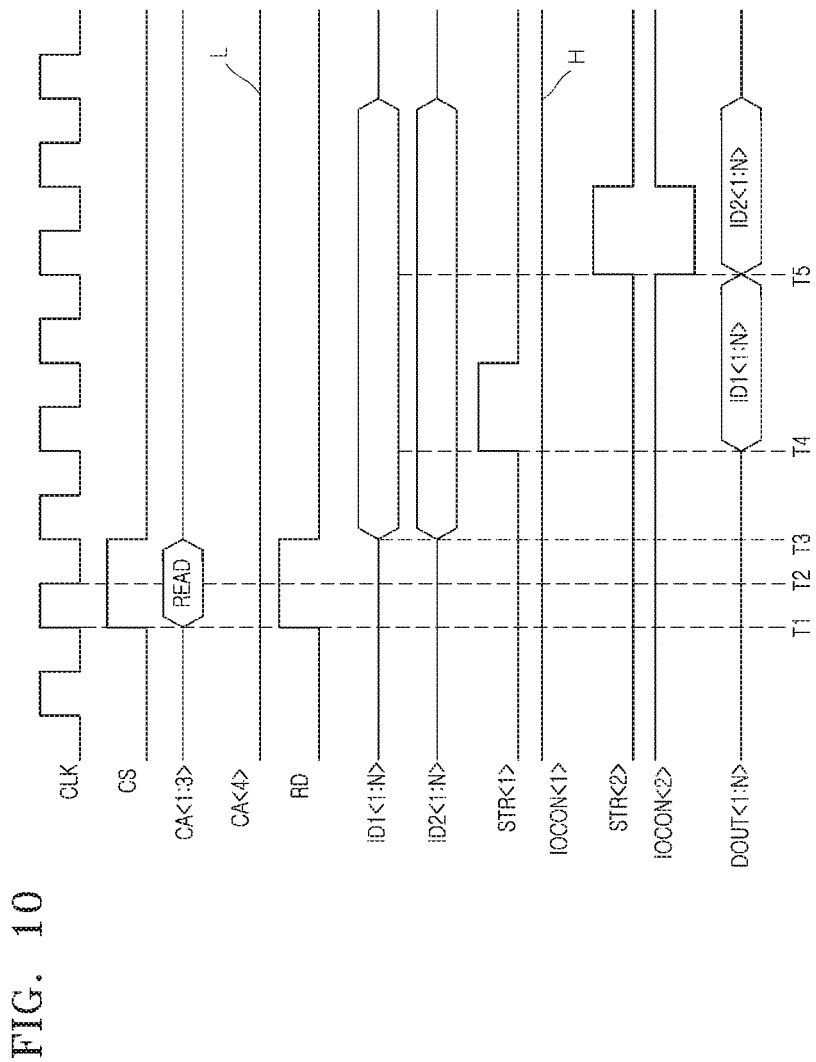
FIG. 10 is a representation of an example of a timing diagram to assist in the explanation of a first burst operation of the semiconductor device in accordance with an embodiment of the disclosure.

A read operation in accordance with an embodiment of the disclosure will be described below with reference to FIG. 10 by providing an example of a read operation for a first bank group and a second bank group in the first burst operation.

At a time point T1, the read signal generation circuit 21 of the read control circuit 20 generates the read signal RD which is enabled to a logic high level, by receiving the chip select signal CS of a logic high level H, the first command address CA<1> of a logic high level H, the second command address CA<2> of a logic low level L and the third command address CA<3> of a logic low level L in synchronization with the rising edge of the clock CLK.

At a time point T2, the address generation circuit 10 generates the first bank group address BG<1> and the second bank group address BG<2> from the first and second command addresses CA<1:2> in synchronization with the falling edge of the clock CLK. The address generation circuit 10 generates the first to fourth bank addresses BK<1:4> from the third and fourth command addresses CA<3:4> in synchronization with the falling edge of the clock CLK.

At a time point T3, the first bank group 31 outputs data stored in any one among the first bank 311, the second bank 312, the third bank 313 and the fourth bank 314 which is selected by the first bank group address BG<1> and the first to fourth bank addresses BK<1:4>, as the first internal data ID1<1:N>. The second bank group 32 outputs data stored in any one among the fifth bank 321, the sixth bank 322, the seventh bank 323 and the eighth bank 324 which is selected by the second bank group address BG<2> and the first to fourth bank addresses BK<1:4>, as the second internal data ID2<1:N>. While FIG. 10 illustrates for the sake of convenience in explanation that the first internal data ID1<1:N> and the second internal data ID2<1:N> are simultaneously generated at the time point T3, it is to be noted that the first internal data ID1<1:N> and the second internal data ID2<1:N> may be generated at different time points.

At a time point T4, the strobe signal generation circuit 22 of the read control circuit 20 generates the first strobe signal STR<1> including a pulse of a logic high level, by delaying the read signal RD of the time point T1 according to the burst information of a logic low level input through the fourth command address CA<4>.

The control signal generation circuit 23 of the read control circuit 20 generates the first output control signal IOCON<1> of a logic high level by blocking the first strobe signal STR<1> since the fourth command address CA<4> is a logic low level.

The first output circuit 41 of the data output circuit 40 latches the first internal data ID1<1:N> during a period in which the first output control signal TOCON<1> is a logic high level, and generates the output data DOUT<1:N> from the latched first internal data ID1<1:N> since the first strobe signal STR<1> transitions from a logic low level to a logic high level. At this time, the first output circuit 41 operates like a latch circuit, and thereby, generates the output data DOUT<1:N> from the first internal data ID1<1: N>.

At a time point T5, the strobe signal generation circuit 22 of the read control circuit 20 generates the second strobe signal STR<2> including a pulse of a logic high level, by delaying the read signal RD of the time point T1 according to the burst information of a logic low level input through the fourth command address CA<4>.

The control signal generation circuit 23 of the read control circuit 20 generates the second output control signal IOCON<2> of a logic low level by transferring the second strobe signal STR<2> since the fourth command address CA<4> is a logic low level.

The first output circuit 41 of the data output circuit 40 generates the output data DOUT<1:N> from the second internal data ID2<1:N> which is transferred at a time point when the second output control signal IOCON<2> transitions from a logic high level to a logic low level and the second strobe signal STR<2> transitions from a logic low level to a logic high level. At this time, the first output circuit 41 operates like a flip-flop circuit, and thereby, generates the output data DOUT<1:N> from the second internal data ID2<1:N>.

As is apparent from the above descriptions, the semiconductor device according to an embodiment of the disclosure may set an output priority of internal data through a command address in a burst operation. The semiconductor device may output internal data to be output first, as output data, through performing a latch operation, and output internal data to be output next, as output data, through performing a flip-flip operation, in a burst operation, thereby preventing a collision between the internal data even in a high speed operation. The semiconductor device may output internal data to be output first, as output data, through performing a latch operation, and output internal data to be output next, as output data, through performing a flip-flip operation, in a burst operation, thereby securing the reliability of the output data even in a high speed operation.

Figure 11:
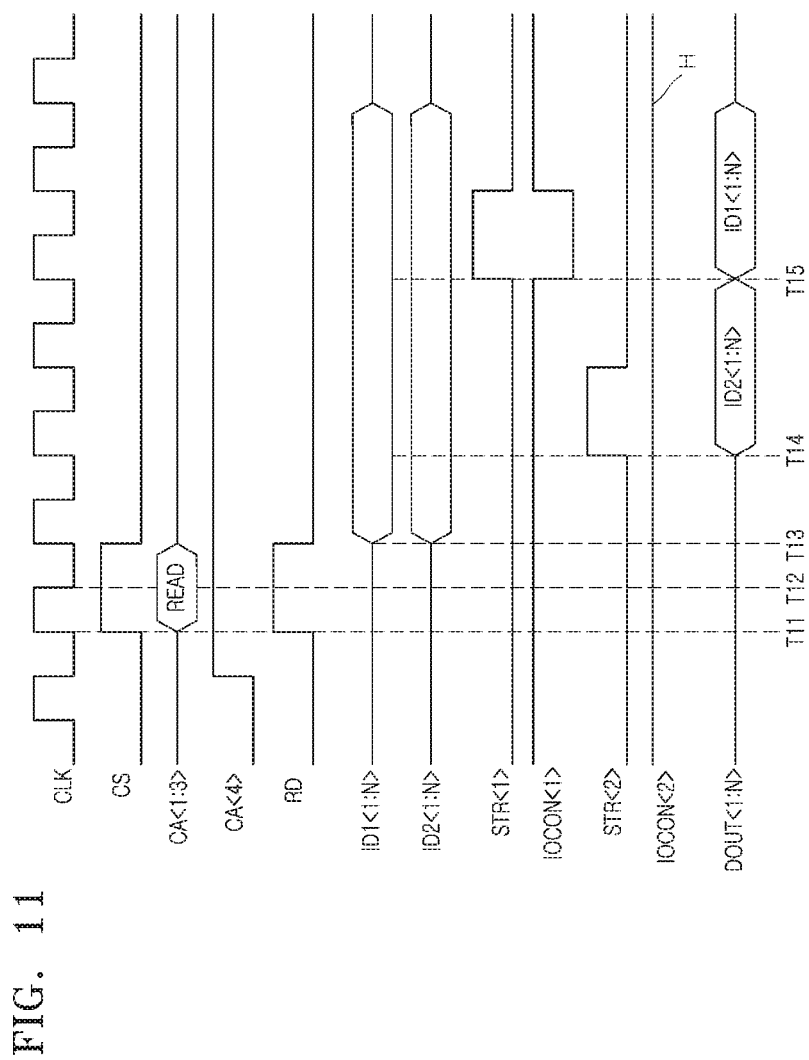
FIG. 11 is a representation of an example of a timing diagram to assist in the explanation of a second burst operation of the semiconductor device in accordance with an embodiment of the disclosure.

A read operation in accordance with an embodiment of the disclosure will be described below with reference to FIG. 11 by providing an example of a read operation for a first bank group and a second bank group in the second burst operation.

At a time point T11, the read signal generation circuit 21 of the read control circuit 20 generates the read signal RD which is enabled to a logic high level, by receiving the chip select signal CS of a logic high level H, the first command address CA<1> of a logic high level H, the second command address CA<2> of a logic low level L and the third command address CA<3> of a logic low level L in synchronization with the rising edge of the clock CLK.

At a time point T12, the address generation circuit 10 generates the first bank group address BG<1> and the second bank group address BG<2> from the first and second command addresses CA<1:2> in synchronization with the falling edge of the clock CLK. The address generation circuit 10 generates the first to fourth bank addresses BK<1:4> from the third and fourth command addresses CA<3:4> in synchronization with the falling edge of the clock CLK.

At a time point T13, the first bank group 31 outputs data stored in any one among the first bank 311, the second bank 312, the third bank 313 and the fourth bank 314 which is selected by the first bank group address BG<1> and the first to fourth bank addresses BK<1:4>, as the first internal data ID1<1:N>. The second bank group 32 outputs data stored in any one among the fifth bank 321, the sixth bank 322, the seventh bank 323 and the eighth bank 324 which is selected by the second bank group address BG<2> and the first to fourth bank addresses 13K<1:4>, as the second internal data ID2<1:N>. While FIG. 11 illustrates for the sake of convenience in explanation that the first internal data ID1<1:N> and the second internal data ID2<1:N> are simultaneously generated at the time point T13, it is to be noted that the first internal data ID1<1:N> and the second internal data ID2<1: N> may be generated at different time points.

At a time point T14, the strobe signal generation circuit 22 of the read control circuit 20 generates the second strobe signal STR<2> including a pulse of a logic high level, by delaying the read signal RD of the time point T11 according to the burst information of a logic high level input through the fourth command address CA<4>.

The control signal generation circuit 23 of the read control circuit 20 generates the second output control signal IOCON<2> of a logic high level by blocking the second strobe signal STR<2> since the fourth command address CA<4> is a logic high level.

The first output circuit 41 of the data output circuit 40 latches the second internal data ID2<1:N> during a period in which the to second output control signal IOCON<2> is a logic high level, and generates the output data DOUT<1:N> from the latched second internal data ID2<1:N> since the second strobe signal STR<2> transitions from a logic low level to a logic high level. At this time, the first output circuit 41 operates like a latch circuit, and thereby, generates the output data DOUT<1:N> from the second internal data ID2<1:N>.

At a time point T15, the strobe signal generation circuit 22 of the read control circuit 20 generates the first strobe signal STR<1> including a pulse of a logic high level, by delaying the read signal RD of the time point T11 according to the burst information of a logic high level input through the fourth command address CA<4>.

The control signal generation circuit 23 of the read control circuit 20 generates the first output control signal IOCON<1> of a logic low level by transferring the first strobe signal STR<1> since the fourth command address CA<4> is a logic high level.

The first output circuit 41 of the data output circuit 40 generates the output data DOUT<1:N> from the first internal data ID1<1:N> which is transferred at a time point when the first output control signal IOCON<1> transitions from a logic high level to a logic low level and the first strobe signal STR<1> transitions from a logic low level to a logic high level. At this time, the first output circuit 41 operates like a flip-flop circuit, and thereby, generates the output data DOUT<1:N> from the first internal data ID1<1:N>.

As is apparent from the above descriptions, the semiconductor device according to an embodiment of the disclosure may set an output priority of internal data through a command address in a burst operation. The semiconductor device may output internal data to be output first, as output data, through performing a latch operation, and output internal data to be output next, as output data, through performing a flip-flip operation, in a burst operation, thereby preventing a collision between the internal data even in a high speed operation. The semiconductor device may output internal data to be output first, as output data, through performing a latch operation, and output internal data to be output next, as output data, through performing a flip-flip operation, in a burst operation, thereby securing the reliability of the output data even in a high speed operation.

Figure 12:
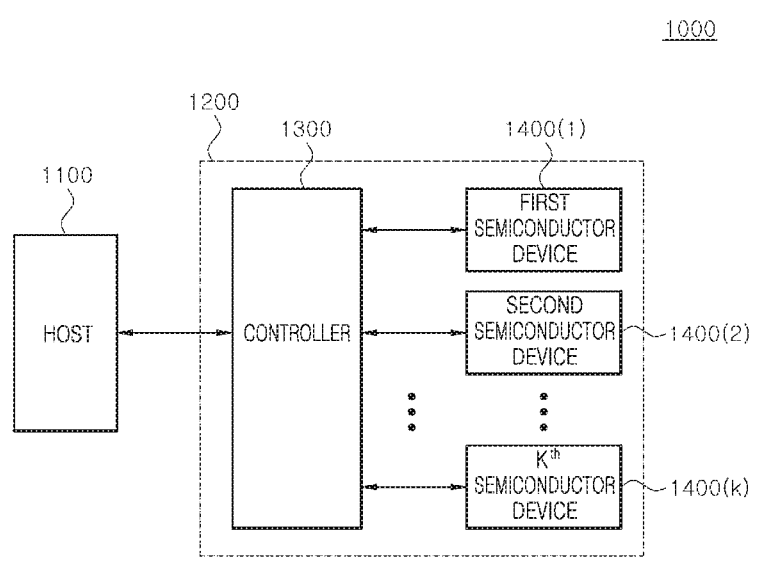
FIG. 12 is a block diagram illustrating a representation of an example of the configuration of an electronic system in accordance with an embodiment of the disclosure.

FIG. 12 is a block diagram illustrating a representation of an example of the configuration of an electronic system 1000 in accordance with an embodiment of the disclosure. As illustrated in FIG. 12, the electronic system 1000 may include a host 1100 and a semiconductor system 1200.

The host 1100 and the semiconductor system 1200 may transmit signals to each other by using an interface protocol. Examples of the interface protocol used between the host 1100 and the semiconductor system 1200 may include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI), and USB (universal serial bus).

The semiconductor system 1200 may include a controller 1300 and semiconductor devices 1400($k$:1). The controller 1300 may control the semiconductor devices 1400($k$:1) such that the semiconductor devices 1400($k$:1) perform a refresh operation, a read operation, a write operation and an ECS operation. Each of the semiconductor devices 1400($k$:1) may set an output priority of internal data through a command address in a burst operation. Each of the semiconductor devices 1400($k$:1) may output internal data to be output first, through performing a latch operation, and output internal data to be output next, through performing a flip-flip operation, in a burst operation, thereby preventing a collision between the internal data even in a high speed operation. Each of the semiconductor devices 1400($k$:1) may output internal data to be output first, through performing a latch operation, and output internal data to be output next, through performing a flip-flip operation, in a burst operation, thereby securing the reliability between the internal data even in a high speed operation.

Each of the semiconductor devices 1400($k$:1) may be realized by the semiconductor device 1 illustrated in FIG. 1. According to an embodiment, the semiconductor device 1 may be realized by one among a DRAM (dynamic random access memory), a PRAM (phase change random access memory), an RRAM (resistive random access memory), an MRAM (magnetic random access memory) and an FRAM (ferroelectric random access memory).

While various embodiments have been described above, it will be understood to those skilled in the art that the embodiments described are by way of example only. Accordingly, the data output method and the semiconductor device using the same described herein should not be limited based on the described embodiments.

What is claimed is:

1. A semiconductor device comprising:
    a read control circuit configured to generate first and second output control signals including pulses which are selectively generated, from first and second strobe signals based on burst information; and
    a data output circuit configured to latch first internal data based on the pulse of the first output control signal, transfer second internal data at a time when the second output control signal level-transitions, and generate output data from the latched first internal data and the transferred second internal data.

2. The semiconductor device according to claim 1, wherein the burst information is input into the read control circuit through a command address which is input from an outside.

3. The semiconductor device according to claim 1, wherein the first internal data is a signal which is output from a first bank group, and the second internal data is a signal which is output from a second bank group.

4. The semiconductor device according to claim 1, wherein the pulse of the second output control signal is generated when a first burst operation is performed depending on the burst information, and the pulse of the first output control signal is generated when a second burst operation is performed depending on the burst information.

5. The semiconductor device according to claim 4, wherein the first burst operation is an operation in which the first internal data is output as the output data and thereafter the second internal data is output as the output data, and the second burst operation is an operation in which the second internal data is output as the output data and thereafter the first internal data is output as the output data.

6. The semiconductor device according to claim 1, wherein the burst information includes a logic level of a command address.

7. The semiconductor device according to claim 6, wherein when the logic level of the command address is a first logic level the first strobe signal is generated before the second strobe signal and when the logic level of the command address is a second logic level different from the first logic level the second strobe signal is generated before the first strobe signal.

8. The semiconductor device according to claim 1, wherein the read control circuit comprises:
    a read signal generation circuit configured to generate a read signal which is enabled when a chip select signal and first to third command addresses are a preset combination in synchronization with a clock;
    a strobe signal generation circuit configured to generate the first and second strobe signals from the read signal depending on a logic level of a fourth command address including the burst information; and
    a control signal generation circuit configured to generate the first and second output control signals by transferring or blocking the first and second strobe signals depending on a logic level of the fourth command address.

9. The semiconductor device according to claim 8, wherein the control signal generation circuit comprises:
    a first logic circuit configured to block the first strobe signal when the fourth command address is a first logic level, and output the first output control signal by inverting and buffering the first strobe signal when the fourth command address is a second logic level; and
    a second logic circuit configured to output the second output control signal by inverting and buffering the second strobe signal when the fourth command address is the first logic level, and block the second strobe signal when the fourth command address is the second logic level.

10. The semiconductor device according to claim 1, wherein the data output circuit outputs the first internal data as the output data and thereafter outputs the second internal data as the output data or outputs the second internal data as the output data and thereafter outputs the first internal data as the output data, depending on logic levels of the first and second strobe signals and the first and second output control signals.

11. The semiconductor device according to claim 1, wherein the data output circuit comprises:
    a first data transfer circuit configured to generate the output data by latching or transferring the first internal data depending on logic levels of the first strobe signal and the first output control signal; and
    a second data transfer circuit configured to generate the output data by latching or transferring the second internal data depending on logic levels of the second strobe signal and the second output control signal.

12. A semiconductor device comprising:
    a memory region including first to fourth bank groups, and configured to output first to fourth internal data stored in the first to fourth bank groups, in a read operation;
    a read control circuit configured to generate first to fourth strobe signals in the read operation, and generate first to fourth output control signals including pulses which are selectively generated, from the first to fourth strobe signals depending on burst information; and a data output circuit configured to generate output data by latching any one of the first to fourth internal data by pulses of the first to fourth strobe signals and the first to fourth output control signals, and generate the output data by transferring any one of the first to fourth internal data at a time when the first to fourth output control signals level-transition.

13. The semiconductor device according to claim 12, wherein the burst information includes a logic level of a command address.

14. The semiconductor device according to claim 13, wherein when the logic level of the command address is a first logic level the first strobe signal is generated before the second strobe signal and the third strobe signal is generated before the fourth strobe signal, and when the logic level of the command address is a second logic level different from the first logic level the second strobe signal is generated before the first strobe signal and the fourth strobe signal is generated before the third strobe signal.

15. The semiconductor device according to claim 12, wherein each of the first to fourth bank groups includes a plurality of banks.

16. The semiconductor device according to claim 12, wherein the burst information is input in to the read control circuit through a command address.

17. The semiconductor device according to claim 12, wherein the read control circuit comprises:
a read signal generation circuit configured to generate a read signal which is enabled when a chip select signal and first to third command addresses are a preset combination in synchronization with a clock;
a strobe signal generation circuit configured to generate the first to fourth strobe signals from the read signal depending on a logic level of a fourth command address including the burst information; and
a control signal generation circuit configured to generate the first to fourth output control signals by transferring or blocking the first to fourth strobe signals depending on a logic level of the fourth command address.

18. The semiconductor device according to claim 17, wherein the control signal generation circuit comprises:
a first logic circuit configured to block the first strobe signal when the fourth command address is a first logic level, and output the first output control signal by inverting and buffering the first strobe signal when the fourth command address is a second logic level;
a second logic circuit configured to output the second output control signal by inverting and buffering the second strobe signal when the fourth command address is the first logic level, and block the second strobe signal when the fourth command address is the second logic level;
a third logic circuit configured to block the third strobe signal when the fourth command address is the first logic level, and output the third output control signal by inverting and buffering the third strobe signal when the fourth command address is the second logic level; and
a fourth logic circuit configured to output the fourth output control signal by inverting and buffering the fourth strobe signal when the fourth command address is the first logic level, and block the fourth strobe signal when the fourth command address is the second logic level.

19. The semiconductor device according to claim 12, wherein the data output circuit outputs the first and third internal data as the output data and thereafter outputs the second and fourth internal data as the output data or outputs the second and fourth internal data as the output data and thereafter outputs the first and third internal data as the output data, depending on logic levels of the first to fourth strobe signals and the first to fourth output control signals.

20. The semiconductor device according to claim 12, wherein the data output circuit generates the output data by latching any one of the first and third internal data or the second and fourth internal data during a period in which pulses of the first to fourth strobe signals and the first to fourth output control signals are generated, and thereafter, generates the output data by receiving the unselected other of the first and third internal data or the second and fourth internal data at a time when logic levels of the first to fourth strobe signals and the first to fourth output control signals transition.

21. The semiconductor device according to claim 12, wherein the data output circuit comprises:
a first output circuit configured to output the output data by latching any one of the first internal data and the second internal data depending on logic levels of the first and second strobe signals and the first and second output control signals, and thereafter, output the output data by receiving the unselected other of the first internal data and the second internal data; and
a second output circuit configured to output the output data by latching any one of the third internal data and the fourth internal data depending on logic levels of the third and fourth strobe signals and the third and fourth output control signals, and thereafter, output the output data by receiving the unselected other of the third internal data and the fourth internal data.

22. The semiconductor device according to claim 21, wherein the first output circuit comprises:
a first data transfer circuit configured to generate the output data by latching or transferring the first internal data depending on logic levels of the first strobe signal and the first output control signal; and
a second data transfer circuit configured to generate the output data by latching or transferring the second internal data depending on logic levels of the second strobe signal and the second output control signal.

23. The semiconductor device according to claim 21, wherein the second output circuit comprises:
a third data transfer circuit configured to generate the output data by latching or transferring the third internal data depending on logic levels of the third strobe signal and the third output control signal; and
a fourth data transfer circuit configured to generate the output data by latching or transferring the fourth internal data depending on logic levels of the fourth strobe signal and the fourth output control signal.

24. A semiconductor device comprising:
a read control circuit configured to generate first and second strobe signals depending on burst information input from a command address in a read operation, and generate first and second output control signals including pulses which are selectively generated, from the first and second strobe signals;
a first output circuit configured to generate output data by latching first internal data or receiving the first internal data by the first strobe signal and the first output control signal; and a second output circuit configured to generate the output data by latching second internal data or receiving the second internal data by the second strobe signal and the second output control signal.

25. The semiconductor device according to claim 24, wherein the first output circuit outputs the output data by latching the first internal data by the first output control signal or generates the output data from the first internal data transferred at a time when the first output control signal transitions.

26. The semiconductor device according to claim 24, wherein the second output circuit outputs the output data by latching the second internal data by the second output control signal or generates the output data from the second internal data transferred at a time when the second output control signal transitions.

27. A data output method comprising:
generating output control signals by entering a read operation depending on a logic level combination of a command address, and generating first and second strobe signals and first and second output control signals depending on burst information input from the command address;
generating output data including first data by latching first internal data during a period in which pulses of the first strobe signal and the first output control signal are generated; and
generating the output data including second data by receiving second internal data at a time point when logic levels of the second strobe signal and the second output control signal transition.

28. The data output method according to claim 27, wherein the pulse of the second output control signal is generated when a first burst operation is performed depending on the burst information, and the pulse of the first output control signal is generated when a second burst operation is performed depending on the burst information.

29. The data output method according to claim 28, wherein the first burst operation is an operation in which the first internal data is output as the output data and thereafter the second internal data is output as the output data, and the second burst operation is an operation in which the second internal data is output as the output data and thereafter the first internal data is output as the output data.

\* \* \* \* \*